(12) United States Patent
Jones et al.

(10) Patent No.: US 7,783,466 B2
(45) Date of Patent: Aug. 24, 2010

(54) IC CHIP PARAMETER MODELING

(75) Inventors: John R. Jones, Shelburne, VT (US); Steven G. Lovejoy, Hopewell Junction, NY (US); Henry W. Trombley, Starksboro, VT (US); Josef S. Watts, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 635 days.

(21) Appl. No.: 11/742,620

(22) Filed: May 1, 2007

(65) Prior Publication Data

US 2008/0275675 A1  Nov. 6, 2008

(51) Int. Cl.
*G06F 17/50* (2006.01)
(52) U.S. Cl. ............................................ 703/14; 716/4
(58) Field of Classification Search ............... 716/4; 703/14
See application file for complete search history.

(56) References Cited

U.S. PATENT DOCUMENTS

| | | | |
|---|---|---|---|
| 6,314,390 B1* | 11/2001 | Bittner et al. | 703/14 |
| 7,263,477 B2* | 8/2007 | Chen et al. | 703/13 |
| 2003/0114944 A1* | 6/2003 | Bernstein et al. | 700/97 |
| 2005/0144576 A1* | 6/2005 | Furuta et al. | 716/4 |
| 2006/0100873 A1* | 5/2006 | Bittner et al. | 704/256.2 |

* cited by examiner

*Primary Examiner*—Paul L Rodriguez
*Assistant Examiner*—Juan C Ochoa
(74) *Attorney, Agent, or Firm*—Ryan K. Simmons; Hoffman Warnick LLC

(57) ABSTRACT

A method and system are disclosed for preserving measured temperature and geometric behavior of a hardware model while adjusting the model to match specified target values. In one embodiment, the method includes measuring a characteristic of an integrated circuit (IC) chip at a plurality of temperatures; modeling to form a hardware model for the characteristic versus temperature based on the measuring; obtaining a known first target value of the characteristic for at least one temperature in the hardware model; determining a plurality of second target values for the characteristic for a corresponding plurality of temperatures in the hardware model; and modeling to form a target model for the characteristic based on the first known target value and the plurality of second target values.

6 Claims, 4 Drawing Sheets

IC CHIP PARAMETER MODELING

BACKGROUND

1. Technical Field

The disclosure relates generally to integrated circuit (IC) chip modeling, and more particularly, to a method and system for preserving measured temperature and geometric behavior of a hardware model while adjusting the model to match specified target values.

2. Background Art

This invention relates to the field of compact modeling of semiconductor devices and to the problem of making a model "match" both a specific measured set of hardware and a set of nominal geometric and electrical specifications. As shown in FIG. 1A, a model 10 is first fit to a particular sample of hardware and then adjusted to match "nominal values" specified for the device, i.e., design manual targets, to obtain a target model 12. The hardware, including many geometries, is typically measured at two or three temperatures (shown by +marks in FIG. 1A) and the model 10 is fit to match the hardware at all measured geometries and temperatures. This process captures a great amount of physical information about the device. However, design manual targets (shown as * in FIG. 1A) are typically only specified at one (room) temperature where in-line data is taken for line control and only for selected bias conditions at selected geometries. When the model is adjusted to match the design manual targets (model 12), the physical content (correct temperature and geometric behavior) may not be preserved. This is illustrated by how model 12 does not track with model 10.

SUMMARY

A method and system are disclosed for preserving measured temperature and geometric behavior of a hardware model while adjusting the model to match specified target values. In one embodiment, the method includes measuring a characteristic of an integrated circuit (IC) chip at a plurality of temperatures; modeling to form a hardware model for the characteristic versus temperature based on the measuring; obtaining a known first target value of the characteristic for at least one temperature in the hardware model; determining a plurality of second target values for the characteristic for a corresponding plurality of temperatures in the hardware model; and modeling to form a target model for the characteristic based on the first known target value and the plurality of second target values.

A first aspect of the disclosure provides a method comprising: measuring a characteristic of an integrated circuit (IC) chip versus temperature at a plurality of temperatures; modeling to form a hardware model for the characteristic based on the measuring; obtaining a known first target value of the characteristic for at least one temperature in the hardware model; determining a plurality of second target values for the characteristic for a corresponding plurality of temperatures in the hardware model; and modeling to form a target model for the characteristic based on the first known target value and the plurality of second target values.

A second aspect of the disclosure provides a system comprising: means for obtaining a measurement of a characteristic of an integrated circuit (IC) chip versus temperature at a plurality of temperatures; means for modeling to form a hardware model for the characteristic based on the measuring; means for obtaining a known first target value of the characteristic for at least one temperature in the hardware model; means for determining a plurality of second target values for the characteristic for a corresponding plurality of temperatures in the hardware model; means for modeling to form a target model for the characteristic based on the first known target value and the plurality of second target values.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 2:
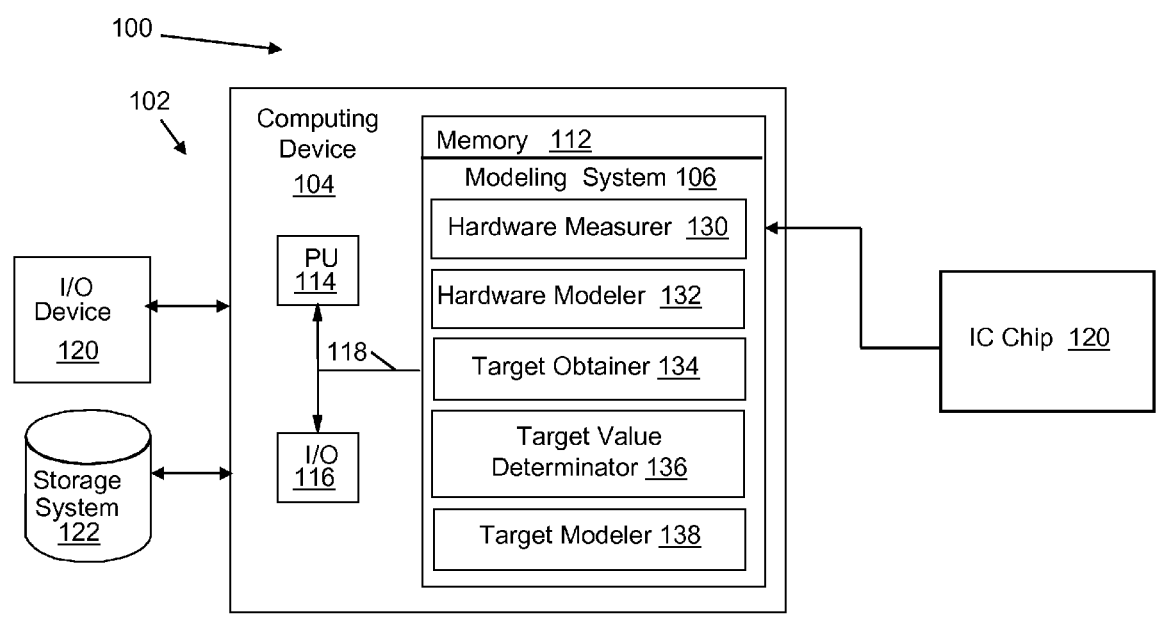
FIG. 2 shows a block diagram of one embodiment of a system according to the disclosure.

Turning to the drawings, FIG. 2 shows an illustrative environment 100 for modeling an IC chip characteristic. To this extent, environment 100 includes a computer infrastructure 102 that can perform the various process steps described herein for modeling an IC chip characteristic. In particular, computer infrastructure 102 is shown including a computing device 104 that comprises a modeling system 106, which enables computing device 104 to model an IC chip characteristic by performing the processes of the disclosure.

Computing device 104 is shown including a memory 112, a processor (PU) 114, an input/output (I/O) interface 116, and a bus 118. Further, computing device 104 is shown in communication with an external I/O device/resource 120 and a storage system 122. As is known in the art, in general, processor 114 executes computer program code, such as modeling system 106, that is stored in memory 112 and/or storage system 122. While executing computer program code, processor 114 can read and/or write data, such as modeling, to/from memory 112, storage system 122, and/or I/O interface 116. Bus 118 provides a communications link between each of the components in computing device 104. I/O device 116 can comprise any device that enables a user to interact with computing device 104 or any device that enables computing device 104 to communicate with one or more other computing devices. Input/output devices (including but not limited to keyboards, displays, pointing devices, etc.) can be coupled to the system either directly or through intervening I/O controllers.

In any event, computing device 104 can comprise any general purpose computing article of manufacture capable of executing computer program code installed by a user (e.g., a personal computer, server, handheld device, etc.). However, it is understood that computing device 104 and modeling system 106 are only representative of various possible equivalent computing devices that may perform the various process steps of the disclosure. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in one embodiment, computer infrastructure 102 comprises two or more computing devices (e.g., a server cluster) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

As previously mentioned and discussed further below, modeling system 106 enables computing infrastructure 102 to model an IC chip characteristic. To this extent, modeling system 106 is shown including a hardware measurer 130, a hardware modeler 132, a target obtainer 134, a target value determinator 136 and a target modeler 138. Operation of each of these systems is discussed further below. However, it is understood that some of the various systems shown in FIG. 2 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100.

Figure 1A:
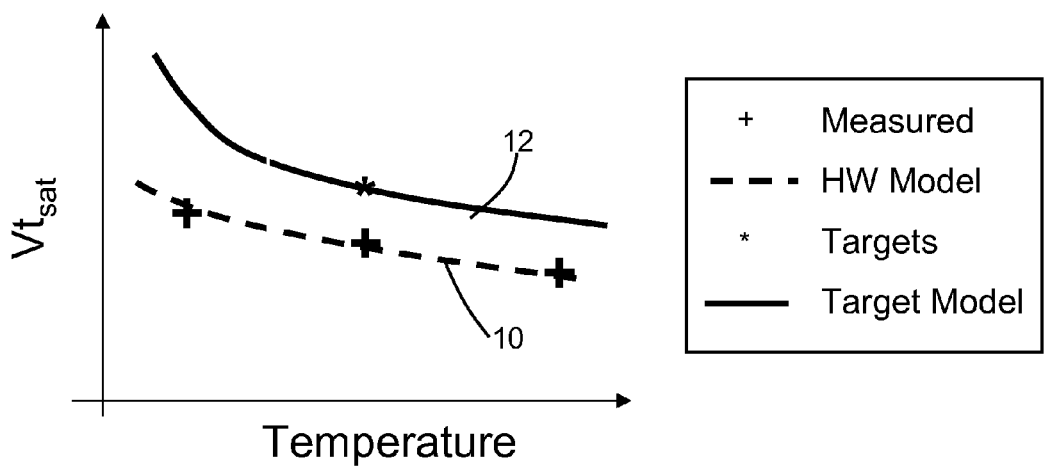
FIG. 1A shows graphs of IC chip threshold voltage modeling illustrating a problem of the conventional method.
Figure 1B:
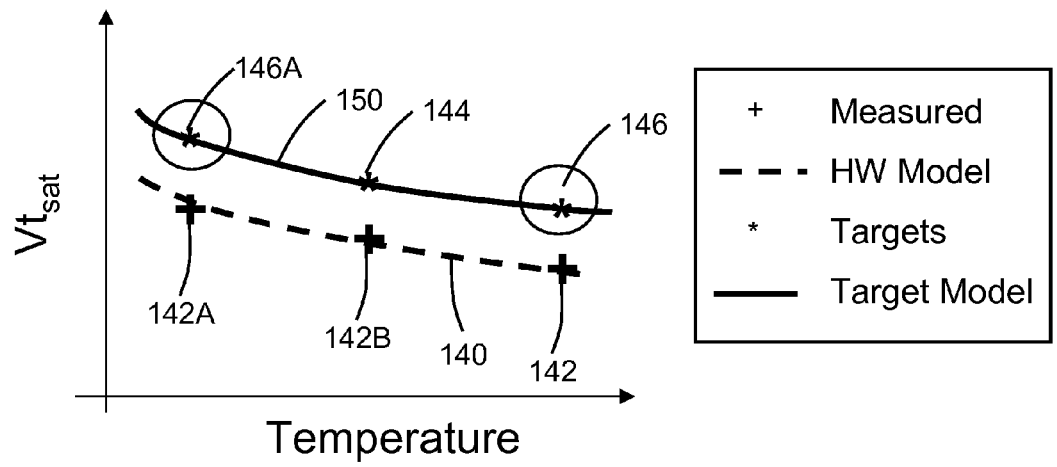
FIG. 1B shows graphs of IC chip threshold voltage modeling according to the disclosure.
Figure 3:
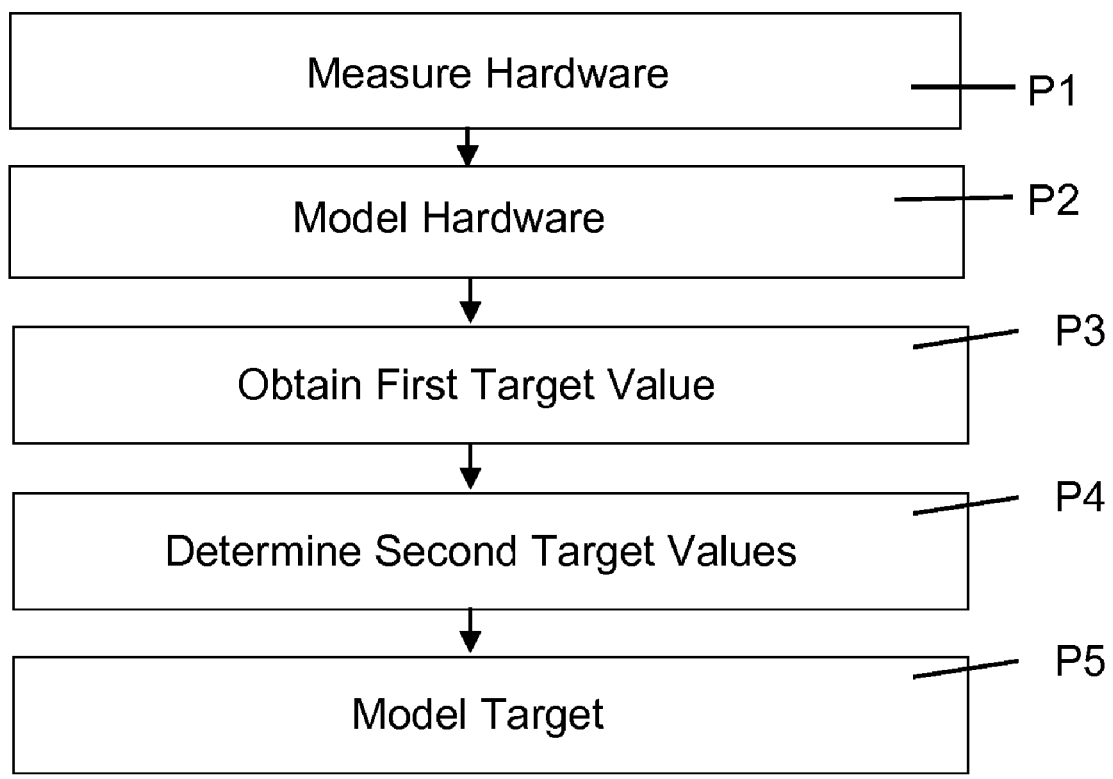
FIG. 3 shows a flow diagram of one embodiment of an operational methodology according to the disclosure.

Turning to FIGS. 1B, 2 and 3, one embodiment of an operational methodology of modeling system 106 will now be described. FIG. 1B shows the characteristic as a threshold voltage ($Vt_{sat}$). The following processes assume that a variation in a characteristic, e.g., threshold voltage, with temperature as measured and modeled and that of a perfectly nominal target model are identical for illustrative/description purposes.

In process P1, hardware measurer 130 obtains a measurement of a characteristic of an integrated circuit (IC) chip at a plurality of temperatures, i.e., measures a characteristic value 142 (+ in FIG. 1B) at each of a plurality of temperatures. The characteristic measuring may be conducted using any now known or later developed techniques to test an IC chip, e.g., probes, testers, etc. The characteristic measured may be any characteristic of an IC chip, e.g., threshold voltage, above-threshold current, below threshold current, capacitance, gate current, derivatives of these currents with respect to voltage, etc.

In process P2, hardware modeler 132 models to form a hardware model for the characteristic based on the measuring. That is, hardware modeler 132 forms model 140 (FIG. 1B) by fitting each value of the characteristic versus temperature. Hardware modeler 132 may use any now known or later developed modeling technique such as linear regression, gradient based local optimization, stochastic global optimization, etc.

In process P3, target obtainer 134 obtains a known first target value 144 of the characteristic for at least one temperature in the hardware model. First target value 144 may be obtained in any now known or later developed fashion, e.g., it may be set by a IC chip manufacturer, extrapolated from a previous technology using historical trends, calculated by finite element based simulation of a proposed manufacturing process, etc.

Figure 4:
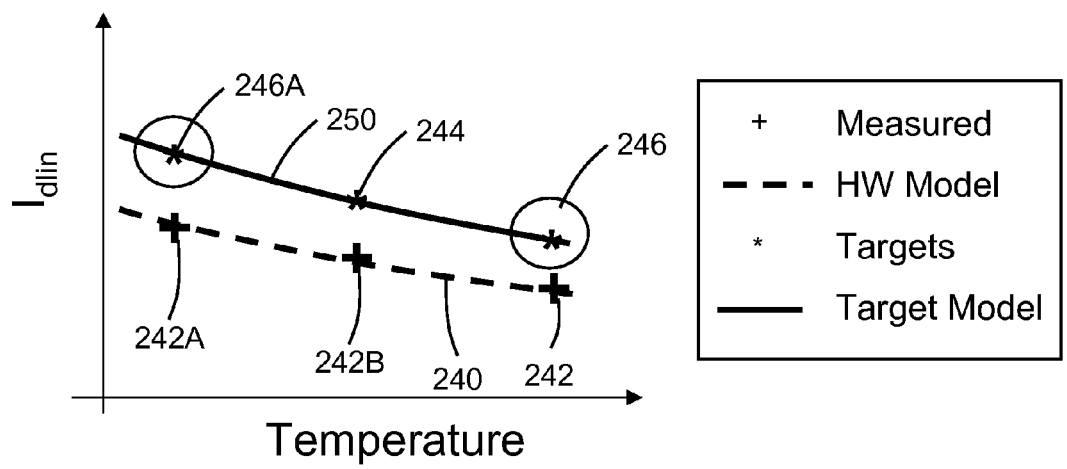
FIG. 4 shows graphs of IC chip above-threshold current modeling according to the disclosure.

In process P4, target value determinator 136 determines a plurality of second target values 146 for the characteristic for a corresponding plurality of temperatures in the hardware model. In the following description, as shown in FIG. 1B or 4, the values of Vt_hardware(T) 142A, Vt_hardware($T_0$) 142B, I(T) 242A and I($T_0$) 242B in the respective hardware models 140, 240 are values attained from the measuring, not the hardware model modeling. It may be possible, however, to perform the following processes by using other extrapolated values from hardware models 140, 240; however, it is not preferred. In one embodiment, where the characteristic is threshold voltage (as in FIG. 1B), the determining includes calculating each second target value 146 according to the following:

$$Vt\_target(T) = Vt\_target(T_0) + (Vt\_hardware(T) - Vt\_hardware(T_0)),$$

where Vt_target(T) is second target value 146A for threshold voltage at a temperature T at which second target value 146A for the threshold voltage is to be determined and at which a value 142A exists for the threshold voltage in hardware model 140, Vt_target($T_0$) is the first target value 144 at a temperature ($T_0$) at which first target value 144 for the threshold voltage is known and at which values for the threshold voltage exists in the hardware model 140, Vt_hardware(T) is a value 142A for the threshold voltage at the temperature T in hardware model 140, and Vt_hardware($T_0$) is a value 142B for the threshold voltage at the temperature $T_0$ in the hardware model 140. In one embodiment, temperature $T_0$ may be room temperature, i.e., approximately 21° C. (70° F.).

The characteristic may also include more than one characteristic. For example, as shown in FIG. 4, the above-described data may also be employed to model above-threshold current ($I_{dlin}$). In this case, target value determinator 134 may calculate each second target value of above-threshold current according to the following:

$$J(T) = J(T_0) \frac{I(T)}{I(T_0)} \left(1 + \left\{ \frac{g_m}{I} \Big|_{T, V_g} - \frac{g_m}{I} \Big|_{T, (V_g - \delta V_t)} \right\} \Delta V_g \right)_T$$

where J(T) is the second target value 246A for the above-threshold current at a temperature T at which the second target value 246A for the above-threshold current is to be determined and at which a value 242A exists for the above-threshold current in hardware model 240, J($T_0$) is the first target value 244 at a temperature ($T_0$) at which the first target value for the above-threshold current is known and at which values 242B for the above-threshold current exist in hardware model 240, I(T) is a value 242A for the above-threshold current at the temperature T in the hardware model 240, I(T₀) is a value 242B for the above-threshold current at the temperature T₀ in hardware model 240, $\delta V_T$ is a difference between Vt_target(T) (146A in FIG. 1B) and Vt_hardware(T) (142A in FIG. 1B), and $\Delta V_t$ is a difference between Vt_target (T) (146A in FIG. 1B) and Vt_target(T₀) (144 in FIG. 1B), and $g_m$ is a derivative of above-threshold current (I) with respect to a gate bias $$\frac{dI_d}{dV_g},$$

where $I_d$ is a drain current and Vg is gate bias. The quantity ($g_m$/I) is evaluated using the measured data at the temperature of the new target and the bias conditions at which the target is defined or bias adjusted for $\delta V_T$.

Figure 5:
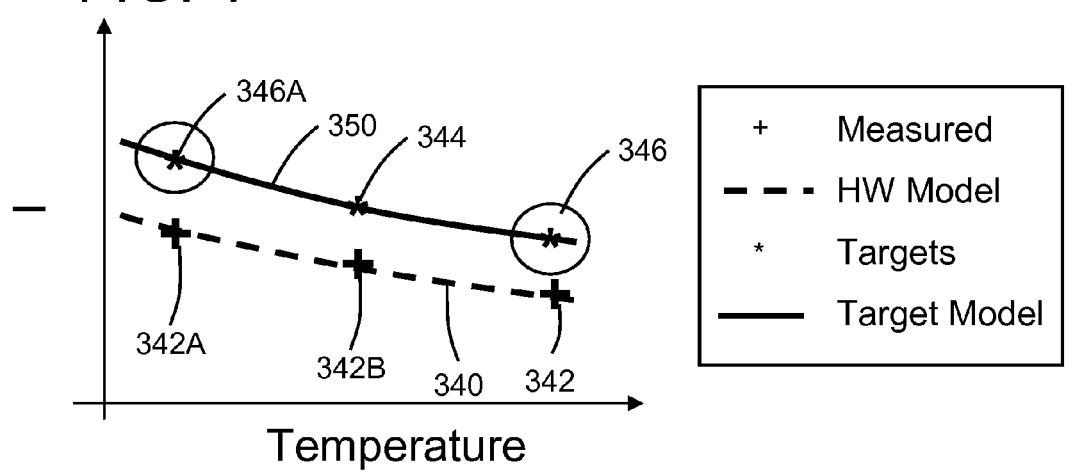
FIG. 5 shows graphs of IC chip below-threshold current modeling according to the disclosure.

As shown in FIG. 5, the above-described data may also be employed with below-threshold current ($I_d$). In this case, target value determinator 134 may calculate each second target value of below-threshold current according to the following:

$$J(T) = I_{Vt}\exp\{A(T)[V_g - V_t + V_x(T)]\}$$

where J(T) is the second target value 346A for the below-threshold current at a temperature T at which the second target value 346A for the below-threshold current is to be determined and at which a value 342A exists for the below-threshold current in hardware model 340;

$I_{Vt}$ is the current at which threshold voltage (Vt) is defined (Vt is gate voltage (Vg) at which this current is measured);

A(T) is gm/l for the second target value 346A at temperature T, gm is the derivative of $I_d$ with respect to gate bias $$\frac{dI_d}{dV_g},$$

where $I_d$ is a drain current, and gm/l is from hardware model 340. If calculated from measured data, gm/l (α) may be calculated according to:

$$\alpha = \frac{\log(I_1/I_2)}{V_1 - V_2},$$

in which $I_1$ is a drain current measured at a first gate bias $V_1$, 12 is a drain current measured at a second gate bias $V_2$, where $V_1$ and $V_2$ are close (e.g., within 0.100 V) to the gate bias for which the target is being calculated, and A(T) is calculated according to:

$$A(T) = A(T_0)\frac{\alpha(T)}{\alpha(T_0)},$$

in which α(T) is gm/l taken from hardware model 340 at temperature T, α(T₀) is gm/l taken from hardware model 340 at temperature T₀, and A(T₀) is gm/l for the first target value 344 at temperature T₀ and is calculated according to:

$$A(T_0) = \log\left(\frac{J(T_0)}{I_{Vt}}\right)\left(\frac{1}{V_g - V_t(T_0) + V_x(T_0)}\right),$$

in which $V_t(T_0)$ is a target threshold voltage 144 (FIG. 1B) at temperature T₀, J(T₀) is the first target value 344 at a temperature (T₀) at which the first target value for the below-threshold current is known and at which values 342B for the below-threshold current exist in hardware model 340, and $V_x(T_0)$ is a correction to Vt at temperature T₀ account for a transition to linear current above Vt evaluated using hardware model 340 and is calculated according to:

$$V_x(T_0) = \frac{\log(I(T_0)/I_{Vt})}{\alpha(T_0)} - (V_g - V_T(T_0))$$

in which I(T₀) is a value 342B for the below-threshold current at the temperature T₀ in hardware model 340.

In process P5, target modeler 138 models to form a target model 150, 250 (FIGS. 1B and 4) for the characteristic based on the first known target value 144, 244 and a plurality of second target values 146, 246.

In another embodiment, target value determinator 136 may also determine target model(s) 150, 250 for a plurality of lengths of a structure of the IC chip. That is, the above-described processes may be repeated for various lengths of a particular structure, e.g., a line, gate, etc., within an IC chip.

As discussed herein, various systems and components are described as "obtaining" data (e.g., modeling system 106, target obtainer 134, etc.). It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

While shown and described herein as a method and system for IC chip characteristic modeling, it is understood that the disclosure further provides various alternative embodiments. That is, the disclosure can take the form of an entirely hardware embodiment, an entirely software embodiment or an embodiment containing both hardware and software elements. In a preferred embodiment, the disclosure is implemented in software, which includes but is not limited to firmware, resident software, microcode, etc. In one embodiment, the disclosure can take the form of a computer program product accessible from a computer-usable or computer-readable medium providing program code for use by or in connection with a computer or any instruction execution system, which when executed, enables a computer infrastructure to model an IC chip characteristic. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, such as storage system 122, magnetic tape, a removable computer diskette, a random access memory (RAM), a read-only memory (ROM), a tape, a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processing unit 114 coupled directly or indirectly to memory elements through a system bus 118. The memory elements can include local memory, e.g., memory 112, employed during actual execution of the program code, bulk storage (e.g., storage system 122), and cache memories which provide temporary storage of at least some program code in order to reduce the number of times code must be retrieved from bulk storage during execution.

In another embodiment, the disclosure provides a method of generating a system for modeling an IC chip characteristic. In this case, a computer infrastructure, such as computer infrastructure 102 (FIG. 2), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 104 (FIG. 2), from a computer-readable medium; (2) adding one or more computing devices to the computer infrastructure; and (3) incorporating and/or modifying one or more existing systems of the computer infrastructure, to enable the computer infrastructure to perform the process steps of the disclosure.

In still another embodiment, the disclosure provides a business method that performs the process described herein on a subscription, advertising, and/or fee basis. That is, a service provider, such as an application service provider, could offer to model an IC chip characteristic as described herein. In this case, the service provider can manage (e.g., create, maintain, support, etc.) a computer infrastructure, such as computer infrastructure 102 (FIG. 2), that performs the process described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method comprising:

measuring a characteristic of an integrated circuit (IC) chip at a plurality of temperatures;

modeling to form a hardware model for the characteristic versus temperature based on the measuring;

obtaining a known first target value of the characteristic for at least one temperature in the hardware model;

determining a plurality of second target values for the characteristic for a corresponding plurality of temperatures in the hardware model, wherein in the case that the characteristic is threshold voltage, the determining includes calculating each second target value according to the following: Vt_target(T)=Vt_target($T_0$)+ (Vt_hardware(T)−Vt_hardware $T_0$)), where Vt_target (T) is the second target value for threshold voltage at a temperature T at which the second target value for the threshold voltage is to be determined and at which a value exists for the threshold voltage in the hardware model, Vt_target $T_0$ is the first target value at a temperature ($T_0$) at which the first target value for the threshold voltage is known and at which values for the threshold voltage exist in the hardware model, Vt_hardware(T) is a value for the threshold voltage at the temperature T in the hardware model and Vt_hardware ($T_0$) is a value for the threshold at the temperature $T_0$ in the hardware model, and wherein in the case that the characteristic further includes above-threshold current, the determining includes calculating each second target value of above-threshold current according to the following:

$$J(T) = J(T_0) \frac{I(T)}{I(T_0)} \left(1 + \left\{\frac{g_m}{I}\bigg|_{T,V_g} - \frac{g_m}{I}\bigg|_{T,(V_g-\delta V_t)}\right\} \Delta V_g \right)_T$$

where J(T) is the second target value for the above-threshold current at a temperature T at which the second target value for the above-threshold current is to be determined and at which a value exists for the above-threshold current in the hardware model, J($T_0$) is the first target value at a temperature ($T_0$) at which the first target value for the above-threshold current is known and at which values for the above-threshold current exist in the hardware model, I(T) is a value for the above-threshold current at the temperature T in the hardware model I($T_0$) is a value for the above-threshold current at the temperature $T_0$ in the hardware model $\delta V_T$ is a difference between Vt_target(T) and Vt_hardware T, and $\Delta V_g$ is a difference between Vt_target(T) and Vt_target($T_0$), and $g_m$ is a derivative of above-threshold current (I) with respect to a gate bias $$\frac{dI_d}{dV_g},$$

where Id is a drain current and Vg is a gate bias; and modeling to form a target model for the characteristic based on the first known target value and the plurality of second target values.

2. The method of claim 1, wherein in the case that the characteristic further includes below-threshold current, the determining includes calculating each second target value of below-threshold current according to the following:

$$J(T)=I_{Vt}\exp\{A(T)\lfloor V_g-V_t+Vx(T)\rfloor\}$$

where J(T) is the second target value for the below-threshold current at a temperature T at which the second target value for the below-threshold current is to be determined and at which a value exists for the below-threshold current in hardware model;

$I_{Vt}$ is a current at which threshold voltage (Vt) is defined;

A(T) is gm/I for the second target value at temperature T, gm is a derivative of I with respect to gate bias $$\frac{dI_d}{dV_g},$$

where Id is a drain current, and gm/I is from the hardware model and is calculated according to:

$$A(T) = A(T_0)\frac{\alpha(T)}{\alpha(T_0)}$$

in which $\alpha(T)$ is gm/I taken from the hardware model at temperature T, $\alpha(T_0)$ is gm/I taken from the hardware model at temperature $T_0$, $$\alpha = \frac{\log(I_1/I_2)}{V_1 - V_2}$$

in which $I_1$ is a drain current measured at a first gate bias $V_1$, $I_2$ is a drain current measured at a second gate bias $V_2$, where $V_1$ and $V_2$ are close to the gate bias for which the target is being calculated, and $A(T_0)$ is gm/I for the first target value at temperature $T_0$ and is calculated according to:

$$A(T_0) = \log\left(\frac{J(T_0)}{I_{Vt}}\right)\left(\frac{1}{V_g - V_t(T_0) + V_x(T_0)}\right),$$

in which $V_t(T_0)$ is the target threshold voltage at temperature $T_0$, $J(T_0)$ is the first target value at a temperature $(T_0)$ at which the first target value for the below-threshold current is known and at which values for the below-threshold current exist in hardware model, and $V_x(T_0)$ is a correction to Vt at temperature $T_0$ to account for a transition to linear current above Vt evaluated using the hardware model and is calculated according to:

$$V_x(T_0) = \frac{\log(I(T_0)/I_{Vt})}{\alpha(T_0)} - (V_g - V_T(T_0))$$

in which $I(T_0)$ is a value for the below-threshold current at the temperature $T_0$ in the hardware model and I(T) is a value for the below-threshold current at the temperature T in the hardware model.

3. The method of claim 1, wherein the temperature $T_0$ is room temperature.

4. The method of claim 1, wherein the values of Vt_hardware(T), Vt_hardware($T_0$), I(T) and I($T_0$) in the hardware model are values attained from the measuring, not the hardware model modeling.

5. The method of claim 1, further comprising determining the target model for a plurality of lengths of a structure of the IC chip.

6. A system comprising:
a computing device including a processor for executing computer program code;
means for obtaining a measurement of a characteristic of an integrated circuit (IC) chip at a plurality of temperatures;
means for modeling to form a hardware model for the characteristic versus temperature based on the measuring;
means for obtaining a known first target value of the characteristic for at least one temperature in the hardware model;
means for determining a plurality of second target values for the characteristic for a corresponding plurality of temperatures in the hardware model, wherein in the case that the characteristic is threshold voltage, the determining includes calculating each second target value according to the following: Vt_target(T)=Vt_target($T_0$)+(Vt_hardware(T)−Vt_hardware($T_0$)), where Vt_target(T) is the second target value for threshold voltage at a temperature T at which the second target value for the threshold voltage is to be determined and at which a value exists for the threshold voltage in the hardware model Vt_target $T_0$ is the first target value at a temperature $T_0$ at which the first target value for the threshold voltage is known and at which values for the threshold voltage exist in the hardware model, Vt_hardware(T) is a value for the threshold voltage at the temperature T in the hardware model, and Vt_hardware($T_0$) is a value for the threshold at the temperature $T_0$ in the hardware model, and wherein in the case that the characteristic further includes above-threshold current, the determining includes calculating each second target value of above-threshold current according to the following:

$$\frac{dI_d}{dV_g},$$

where J(T) is the second target value for the above-threshold current at a temperature T at which the second target value for the above-threshold current is to be determined and at which a value exists for the above-threshold current in the hardware model, J($T_0$) is the first target value at a temperature $T_o$ at which the first target value for the above-threshold current is known and at which values for the above-threshold current exist in the hardware model, I(T) is a value for the above-threshold current at the temperature T in the hardware model, I($T_0$) is a value for the above-threshold current at the temperature $T_0$ in the hardware model $\delta V_T$ is a difference between Vt_target(T) and Vt_hardware T and $\Delta V_g$ is a difference between Vt_target(T) and Vt_target ($T_0$), and $g_m$ is a derivative of above-threshold current (I) with respect to a gate bias $$J(T) = J(T_0)\frac{I(T)}{I(T_0)}\left(1 + \left\{\frac{g_m}{I}\bigg|_{T,V_g} - \frac{g_m}{I}\bigg|_{T,(V_g-\delta V_t)}\right\}\Delta V_g\right)_T$$

where Id is a drain current and Vg is a gate bias; and
means for modeling to form a target model for the characteristic based on the first known target value and the plurality of second target values.

* * * * *